United States Patent [19]

Takemura

[11] Patent Number: 5,338,722

[45] Date of Patent: Aug. 16, 1994

[54] METHOD OF FORMING SUPERCONDUCTING OXIDE CERAMIC MATERIALS HAVING HIGH CRITICAL DENSITIES OF SUPERCONDUCTING CURRENT

[75] Inventor: Yasuhiko Takemura, Kanagawa, Japan

[73] Assignee: Semiconductor Energy Laboratory Co., Ltd., Kanagawa, Japan

[21] Appl. No.: 32,172

[22] Filed: Mar. 12, 1993

Related U.S. Application Data

[63] Continuation of Ser. No. 824,920, Jan. 22, 1992, abandoned, which is a continuation of Ser. No. 379,973, Jul. 14, 1989, abandoned.

[30] Foreign Application Priority Data

Jul. 18, 1988 [JP] Japan .................. 63-179788

[51] Int. Cl.$^5$ .................. C01G 3/02; H01L 39/24
[52] U.S. Cl. .................. 505/500; 423/593; 505/725; 505/733; 505/742
[58] Field of Search .............. 505/742, 733, 776, 777, 505/778, 779; 423/593, 604; 252/521

[56] References Cited

U.S. PATENT DOCUMENTS

| | | | |
|---|---|---|---|
| 4,900,716 | 2/1990 | Fujita | 505/742 |
| 5,049,542 | 9/1991 | Brass et al. | 505/742 |
| 5,149,684 | 9/1992 | Woolf | 505/742 |

FOREIGN PATENT DOCUMENTS 3270315  11/1988  Japan .................. 505/742

OTHER PUBLICATIONS

Wada et al., "High transition temperature superconductor LaBa$_2$Cu$_3$O$_{7-y}$ with zero resistance at 92K", Jun. 6, 1988, pp. 1989–1991, Appl. Phys. Lett. 52(23).

Kishio et al., "Effect of Residual Water on Superconductivity in (La$_{1-x}$Sr$_x$)$_2$CuO$_{4-\delta}$", Apr. 1987, pp. L466–L467, Japanese Jr. of Applied Physics.

Przyslupski et al., "Superconductive and Magnetic Properties of YBa$_2$Cu$_3$O$_{6.5+y}$ System", 1987, International Jr. of Modern Physics B, vol. 1, No. 2, pp. 443–446.

McCallum et al., "Incongruent Melting of the High Temp. Superconductor YBa$_2$Cu$_3$O$_7$", Aug. 20–26, 1987, XVIII Int. Conf. on Low Temp. Phys., Japan.

Morris et al., "Mobile Oxygen and Isotope Effect in the High Temp. Superconductor YBa$_2$Cu$_3$O$_{7-\delta}$", Apr. 23–24, 1987, Proceed. of Symp. S, 1987 Spring Meeting of the MRS, pp. 209–213.

Ishizawa et al., "Superconducting Properties of Highly Oxidized Superconductor Ba$_{2-x}$Y$_{1+x}$Cu$_3$O$_{2-y}$", May 1987, Japan Jr. of App. Phy., vol. 26, No. 5, pp. L676–L677.

Bhargava et al., "Effects of Atmosphere on Ba$_2$YCu$_3$O$_x$ During Processing", Materials Letters, Oct. 1987, vol. 5, No. 11–12, pp. 495–497.

Chen et al., "Superconductivity and the Tailoring of Lattice Parameters of the Compound YBa$_2$Cu$_3$O$_x$", Adv. Cer. Mat., vol. 2, No. 3B, Spec. Iss., 1987, pp. 457–470.

Gallagher, "Characterization of Ba$_2$YCu$_3$O$_x$ as a Function of Oxygen Partial Pressure Part I: Thermoanalytical Measurements", Adv. Cer. Mat., vol. 2, No. 2, No. 3B, Spec. Iss., 1987, pp. 633–639.

Beyers et al., "On the Relationship Between Processing, Structure, and Superconductivity in Y$_1$Ba$_2$Cu$_3$O$_{9-x}$", Apr. 1987, Presented at MRS Conf., pp. 149–152.

Han et al., "Electrical Conductivity and Thermogravimetric Studies of the High-Tc Superconductor YBa$_2$Cu$_3$O$_x$", Nov. 30–Dec. 4, 1987, MRS Conf., vol. 99, pp. 753–756.

*Primary Examiner*—Paul Lieberman
*Assistant Examiner*—John Boyd
*Attorney, Agent, or Firm*—Sixbey, Friedman, Leedom & Ferguson

[57] ABSTRACT

Superconducting oxide ceramics having a high density of superconducting current are formed without making use of very high temperatures higher than 1000° C. Superconducting oxide material is placed in a crucible, melted and fired at a relatively low temperature. During the melting and firing step, the partial pressure of oxygen is reduced in order to lower the melting point of the ceramic. After the firing, the partial pressure of oxygen is increased.

11 Claims, 2 Drawing Sheets

METHOD OF FORMING SUPERCONDUCTING OXIDE CERAMIC MATERIALS HAVING HIGH CRITICAL DENSITIES OF SUPERCONDUCTING CURRENT This application is a continuation of Ser. No. 07/824,920, filed Jan. 22, 1992, now abandoned, which itself was a continuation of Ser. No. 07/379,973, filed Jul. 14, 1989, abandoned.

BACKGROUND OF THE INVENTION

The present invention relates to method of forming superconduting oxide ceramic materials having high critical densities of superconduting current.

Superconducting oxide ceramics comprising rare metals, alkalline earth metals and copper have been known as superconduting materials having relatively high critical temperature. Such an oxide superconducting ceramic of this type, however, could not pass a superconducting current therethrough at a sufficient current density, when fabricated in wire form. This is considered because the effective cross sectional area thereof may be small as compared with the theoretical area due to its porous structure.

Recently, a relatively high current density has been obtained by melting the superconducting oxide material and recrystallizing the same, which procedure is called the melting method. The superconducting current density has been as high as 10000 A/cm$^2$ by this procedure. The melting method, however, has to be done in a crucible which has been particularly prepared in order to endure temperatures higher than 1300° C. For this reason, it has been required to decrease the melting point of the ceramics. The introduction of excessive copper oxide decreases the melting point. However, this procedure inevitably influences the superconductivity of the ceramic.

SUMMARY OF THE INVENTION

It is therefore an object of the present invention to provide a method of forming superconducting ceramic materials having a high critical density of superconducting current.

In order to accomplish the above and other objects and advantages, superconducting oxide ceramic material is melted in an atmosphere containing oxygen at a partial pressure lower than that of air, and then the partial pressure of the oxygen is increased. The inventor has found that the melting point of superconducting ceramics can be decreased by lowering the partial pressure of oxygen of the surrounding atmosphere of the melting superconducting ceramic material. The relationship between the partial pressure and the melting point is shown in FIG. 1 in the case of $YBa_2Cu_3O_{7-x}$. For example, a superconducting oxide ceramic material is melted and fired at no higher than 1000° C., e.g. 850° C. to 1000° C., which is a durable temperature for a usual crucible, in an atmosphere containing oxygen at its partial pressure no higher than 50 mm Hg, and then the partial pressure is gradually increased to the partial pressure of oxygen in the air.

BRIEF DESCRIPTION OF THE DRAWING

This invention can be better understood from the following detailed description when read in conjunction with the drawing in which.

DETAILED DESCRIPTION OF THE PREFERRED EMBODIMENTS

Figure 1:
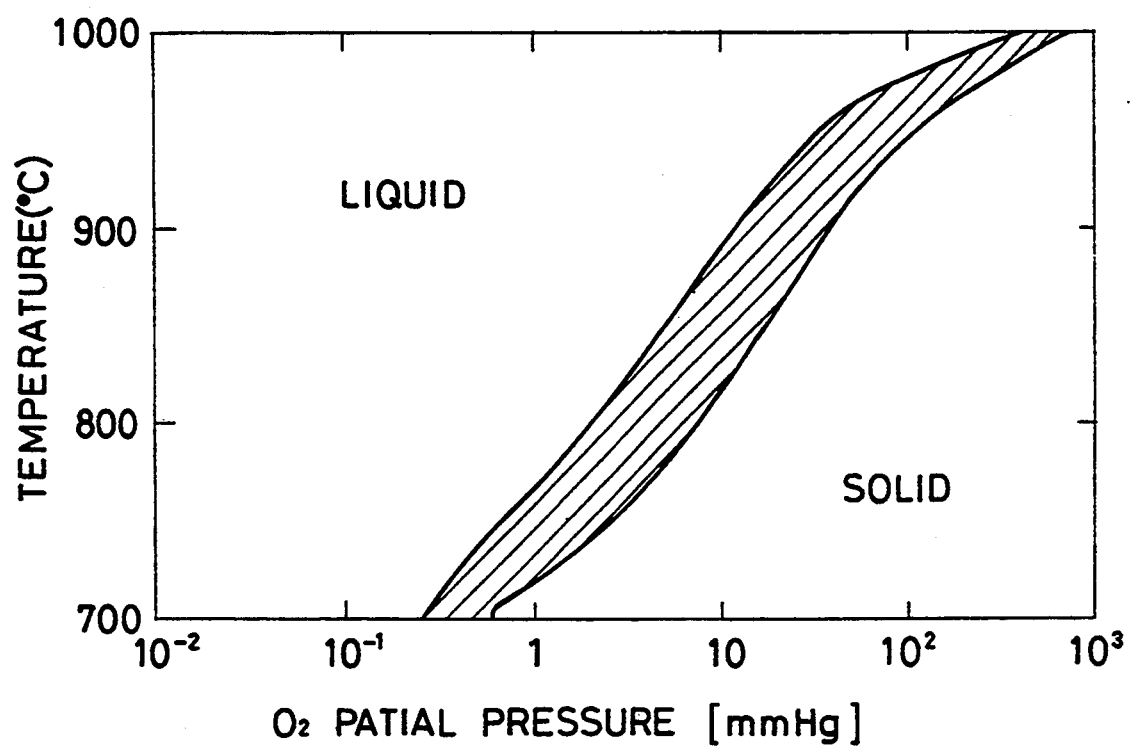
FIG. 1 is a graphical diagram showing the relationship between the partial pressure of oxygen and the melting point in case of $YBa_2Cu_3O_{7-x}$.
Figure 2:
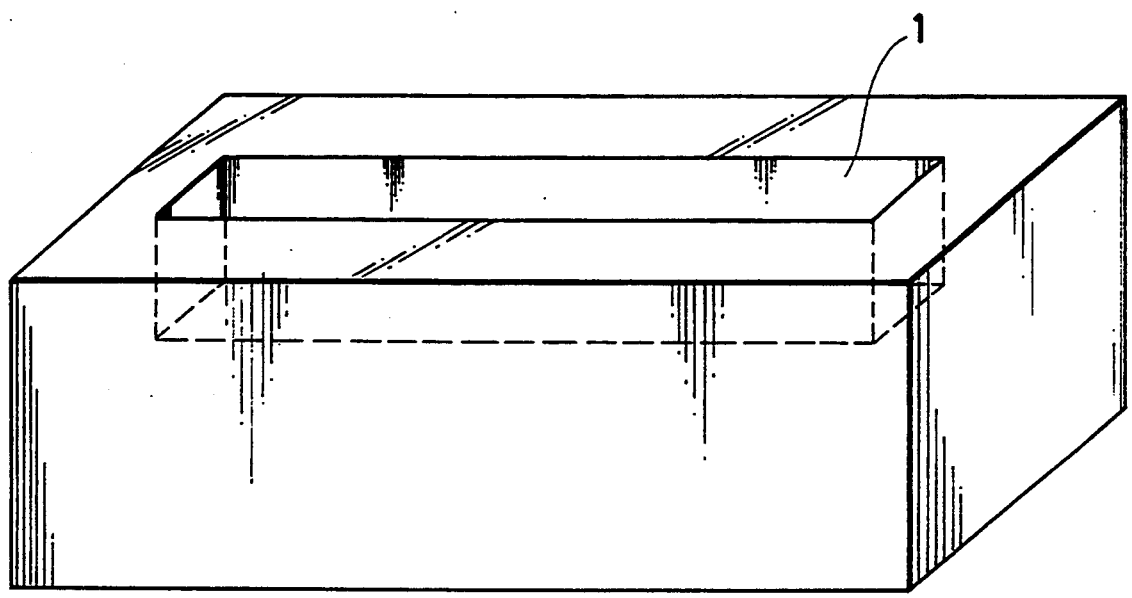
FIG. 2 is a perspective view showing a crucible made of alumina for forming superconducting cermaics in accordance with the present invention.

Referring now to FIG. 2, a crucible made of alumina for forming superconducting cermaics in accordance with the present invention is illustrated. A groove 1 of 20 mm length, 0.5 mm depth, and 0.5 mm width is formed in the crucible. A powdered superconducting ceramic material of $YBa_2Cu_3O_{7-x}$ is placed in the groove 1. The crucible containing the ceramic material is disposed in an oven and heated at 900° C., and maintained in this condition for an hour with an argon atmosphere containing oxygen at a partial pressure of 1 mmHg. The partial pressure of oxygen is then gradually increased at 10 mmHg/hour to 760 mmHg. After 760 mmHg is reached, the temperature is gradually lowered at 50° C./hour to 500° C. At the 500° C., the ceramic material in the crucible is maintained for 12 hours, and naturally cooled in order to complete the formation procedure.

In accordance with experiments, the superconducting ceramic material comprised oxide superconducting plate-like ceramic crystals of 10 microns grain diameter. The critical density of superconducting current was measured to be 11000 A/cm$^2$.

The increase of the oxygen partial pressure can be carried out at once by leaking air into the oven instead of gradually increasing it. In accordance with experiments, when following this procedure, superconducting ceramic materials were obtained using the same formation conditions as were employed by the previous example except for the way of increasing the oxygen partial pressure. The average grain diameter was measured to be 0.3 micrometer. The critical density of superconducting current was measured to be 500 A/cm$^2$.

While several embodiments have been specifically described by way of examples, it is to be appreciated that the present invention is not limited to the particular examples described and that modifications and variations can be made without departing from the scope of the invention as defined by the appended claims. Some examples are as follows. For example, although in the above embodiment a superconducting ceramic material is first heated in an oxygen-reduced atmosphere, the mixture of raw powdered materials, e.g. $Y_2O_3$, $BaCO_3$ and $CuO$ can be used instead of the superconducting ceramic powder.

Superconducting ceramics for use in accordance with the present invention also may be prepared in accordance with the stoichiometric formulae $(A_{1-x}B_x)_yCu_zO_wX_v$, where A is one or more elements of Group IIIb of the Periodic Table, e.g., the rare earth elements, which include Sc, Y, the Lanthanides and actinides B is one or more elements of Group IIa of the Periodic Table, e.g., the alkaline earth metals including beryllium and magnesium, X is one or more elements of a group consisting of Ge, Sn, Pb, F and Cl, and $0<x=1$; $2.0<y<4.0$ preferably $2.5<y<3.5$; $1.0<z<4.0$, preferably $1.5<z<3.5$; $4.0<w<10.0$, preferably $6.0<w<8.0$; and $0<v<3$. Also, superconducting ceramics for use in accordance with the present invention may be prepared consistent with the stoichiometric formulae $(A_{1-x}B_x)_y Cu_z O_w$, where A is one or more elements of Group Va of the Periodic Table such as Bi, Sb and As; B is one or more elements of Group IIa of the Periodic Table, e.g., the alkaline earth metals including beryllium and magnesium, and $0.3<x<1$; $2.0<y<4.0$, preferably $2.5<y<3.5$; $1.0<z<4.0$, preferably $1.5<z<3.5$, and $4.0<w<10.0$, preferably $6.0<w<8.0$. Examples of this general formula are $BiSrCaCu_2O_x$ and $Bi_4Sr_3Ca_3Cu_4O_x$. Tc onset and Tco samples confirmed consistent with the formula $Bi_4Sr_yCa_3Cu_4O_x$ (y is around 1.5) were measured to be 40°–60° K., which is not so high. Relatively high critical temperatures were obtained with samples conforming to the stoichiometric formulae $Bi_4Sr_4Ca_2Cu_4O_x$ and $Bi_2Sr_3Ca_2Cu_2O_x$. The number x denoting the oxygen proportion is 6–10, e.g. around 8.1.

What is claimed is:

1. A method of forming superconducting material comprising the steps of:

placing a material which comprises an oxide superconducting material or precursor material thereof in a reservoir;

heating said reservoir to a temperature at which said material is melted;

maintaining said material at said temperature in an oxygen reduced atmosphere wherein oxygen is present in said reservoir at an initial pressure; and increasing said initial pressure of said oxygen to a higher pressure than said initial pressure while maintaining said temperature to thereby form said superconducting material.

2. The method of claim 1 wherein said initial pressure of oxygen is increased to the partial pressure of oxygen in air.

3. The method of claim 1 wherein the initial pressure of oxygen in said oxygen reduced atmosphere is no higher than 50 mmHg.

4. The method of claim 1 wherein said material is in the form of powder.

5. The method of claim 1 wherein said temperature is no higher than 1000° C.

6. The method of claim 5 wherein said superconducting material is represented by the stoichiometric formulae $(A_{1-x}B_x)_y Cu_z O_w X_v$, where A is one or more elements selected from the group consisting of Sc, Y and Lanthanides, B is one or more elements selected from the group consisting of Be, Mg, Ca, Sr, Ba, and Ra, X is one or more elements selected from the group consisting of Ge, Sn, Pb, F and Cl, and $0<x<1$; $2.0<y<4.0$; $1.0<z<4.0$; $4.0<w<10.0$; and $0<v<3$.

7. A method of forming superconducting material comprising the steps of:

heating a precursor material of a superconducting oxide to an elevated temperature at which said material melts;

maintaining said material at said temperature in an atmosphere in which a partial pressure of oxygen is less than 50 mmHg;

increasing the partial pressure of oxygen while said temperature is maintained; and producing crystals of a superconducting material.

8. The method of claim 7 wherein said precursor comprises yttrium, barium and copper compounds.

9. The method of claim 7 wherein said partial pressure of oxygen is increased to at least the partial pressure of oxygen in air.

10. The method of claim 7 further comprising the step of cooling said material to a lower temperature, at which said material is maintained in an oxygen containing atmosphere.

11. The method of claim 10 wherein said lower temperature is 500° C.

* * * * *